(12) United States Patent
Clark et al.

(10) Patent No.: US 10,192,927 B1
(45) Date of Patent: Jan. 29, 2019

(54) SEMICONDUCTOR DEVICE FOR A NON-VOLATILE (NV) RESISTIVE MEMORY AND ARRAY STRUCTURE FOR AN ARRAY OF NV RESISTIVE MEMORY

(71) Applicant: Crossbar, Inc., Santa Clara, CA (US)

(72) Inventors: Mark Harold Clark, Santa Clara, CA (US); Natividad Vasquez, San Francisco, CA (US); Steven Maxwell, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 134 days.

(21) Appl. No.: 15/206,056

(22) Filed: Jul. 8, 2016

Related U.S. Application Data

(62) Division of application No. 13/705,082, filed on Dec. 4, 2012, now Pat. No. 9,412,790.

(51) Int. Cl.
| | |
|---|---|
| *H01L 29/06* | (2006.01) |
| *H01L 47/00* | (2006.01) |
| *H01L 29/76* | (2006.01) |
| *H01L 27/24* | (2006.01) |
| *H01L 45/00* | (2006.01) |
| *H01L 23/528* | (2006.01) |

(52) U.S. Cl.
CPC ........ *H01L 27/2463* (2013.01); *H01L 23/528* (2013.01); *H01L 27/2436* (2013.01); *H01L 45/1233* (2013.01); *H01L 45/1253* (2013.01); *H01L 45/148* (2013.01); *H01L 45/1608* (2013.01)

(58) Field of Classification Search
CPC . H01L 27/2481; H01L 45/1675; H01L 45/16; H01L 27/2463; H01L 45/08; H01L 45/1233; H01L 45/146
USPC .................................. 257/154; 365/100, 148
See application file for complete search history.

(56) References Cited

U.S. PATENT DOCUMENTS

| | | | |
|---|---|---|---|
| 8,030,634 B2 | 10/2011 | Lung et al. | |
| 2003/0015752 A1* | 1/2003 | Palm ..................... | H01L 27/115 257/315 |

(Continued)

OTHER PUBLICATIONS

Office Action dated Sep. 2, 2014 for U.S. Appl. No. 13/705,082, 17 pages.

(Continued)

*Primary Examiner* — Duy T Nguyen
(74) *Attorney, Agent, or Firm* — Amin, Turocy & Watson, LLP

(57) ABSTRACT

A method for forming a resistive switching device. The method includes providing a substrate having a surface region and forming a first dielectric material overlying the surface region. A first wiring structure is formed overlying the first dielectric material. The method forms one or more first structure comprising a junction material overlying the first wiring structure. A second structure comprising a stack of material is formed overlying the first structure. The second structure includes a resistive switching material, an active conductive material overlying the resistive switching material, and a second wiring material overlying the active conductive material. The second structure is configured such that the resistive switching material is free from a coincident vertical sidewall region with the junction material.

20 Claims, 8 Drawing Sheets

(56) References Cited

U.S. PATENT DOCUMENTS

| | | |
|---|---|---|
| 2004/0202041 A1 | 10/2004 | Hidenori |
| 2006/0134837 A1 | 6/2006 | Subramanian et al. |
| 2006/0246606 A1 | 11/2006 | Hsu et al. |
| 2010/0032637 A1 | 2/2010 | Kinoshita et al. |
| 2011/0186797 A1 | 8/2011 | Herner |
| 2011/0312151 A1* | 12/2011 | Herner ............... H01L 45/148 438/384 |
| 2012/0043520 A1* | 2/2012 | Herner ............... H01L 45/085 257/4 |
| 2012/0170359 A1 | 7/2012 | Wu et al. |
| 2012/0235106 A1 | 9/2012 | Tang et al. |
| 2013/0112935 A1* | 5/2013 | Himeno ............. H01L 45/1253 257/4 |
| 2013/0134383 A1 | 5/2013 | Hwang et al. |

OTHER PUBLICATIONS

Office Action dated Jul. 9, 2015 for U.S. Appl. No. 13/705,082, 22 pages.
Office Action dated Dec. 11, 2015 for U.S. Appl. No. 13/705,082, 17 pages.

* cited by examiner

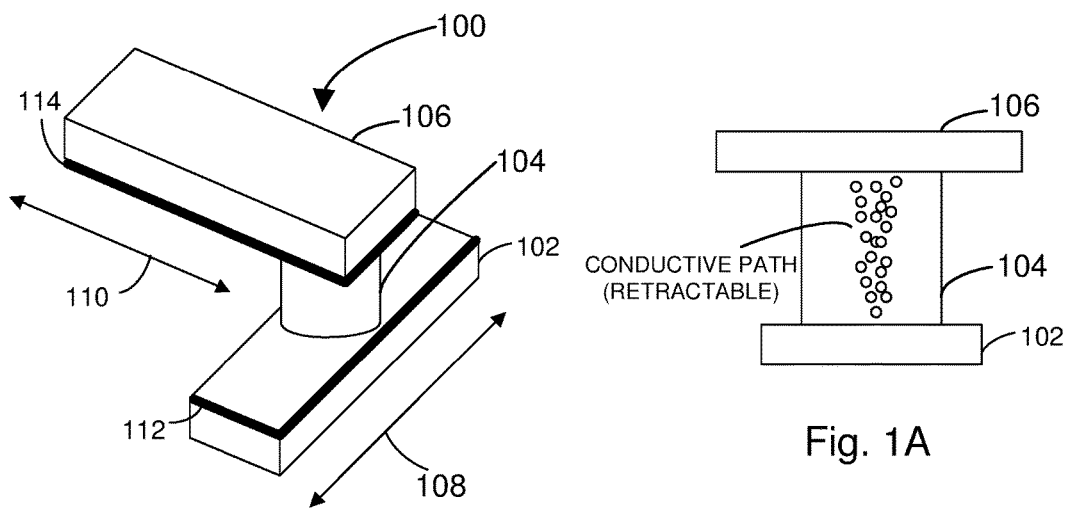
Fig. 1
Fig. 1A
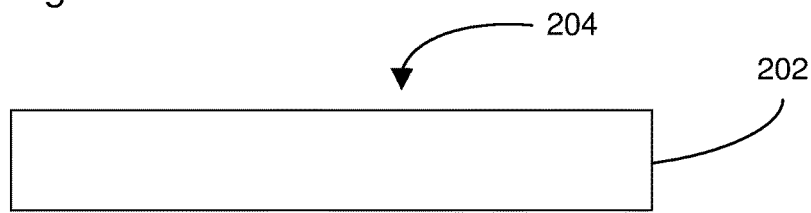
Fig. 2
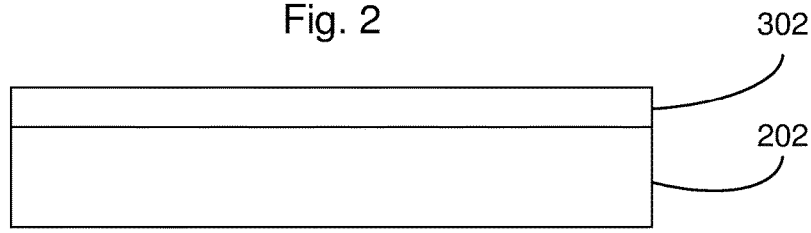
Fig. 3
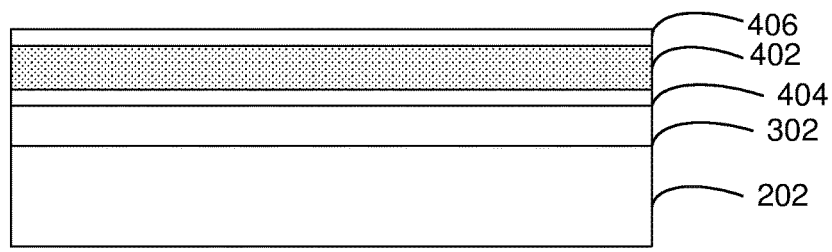
Fig. 4

SEMICONDUCTOR DEVICE FOR A NON-VOLATILE (NV) RESISTIVE MEMORY AND ARRAY STRUCTURE FOR AN ARRAY OF NV RESISTIVE MEMORY

CROSS-REFERENCE TO RELATED APPLICATION

The present application for patent claims the benefit and is a division of U.S. patent application Ser. No. 13/705,082 entitled Scalable RRAM Device Architecture for a Non-Volatile Memory Device and Method, and filed Dec. 4, 2012; the entirety of this application is hereby incorporated by reference herein in its entirety and for all purposes.

BACKGROUND

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

The present invention is directed to resistive switching device. More particularly, embodiments according to the present invention provide a device structure and a method to form a resistive switching device. The resistive switching device has been applied in non-volatile memory device. But it should be recognized that embodiment according to the present invention can have a much broader range of applicability.

In a specific embodiment, a method of forming a resistive switching device for a non-volatile memory device is provided. The method includes providing a substrate having a surface region and forming a first dielectric material overlying the surface region of the substrate. A first wiring structure is formed overlying the first dielectric material and a first junction material comprising a p+ polycrystalline silicon material is deposited overlying at least the first wiring structure. In a specific embodiment, the method forms a hardmask overlying the first junction material. The first junction material is subjected to a first patterning and etching process to form one or more first structure overlying a surface region of the first wiring structure using the hardmask as a masking layer. A second dielectric material is formed overlying the one or more first structures and filling a gap region between the one or more first structures. The method includes depositing a resistive switching material overlying the one or more first structures and a second surface region of the second dielectric material. In a specific embodiment, an active conductive material is formed overlying the resistive switching material. A second wiring material is formed overlying the active conductive material. The method subject a stack of material comprising the second wiring material, the active conductive material, and the resistive switching material to a second patterning process to form a second structure comprising the second wiring material, the active conductive material, and the resistive switching material in a specific embodiment. The first structure including the junction material and the second structure including at least the resistive switching material are configured such that the resistive switching material and the junction material do not share a common sidewall region to inhibit electrical connection between the first wiring structure and the second wiring structure.

In a specific embodiment, a device structure is provided. The device includes a substrate having a service region and a first dielectric material overlying the surface region. A first wiring structure overlies the first dielectric material. In a specific embodiment, the device structure includes a first structure comprising a junction material overlying the first wiring structure. The junction material is configured to be in physical and electrical contact with the first wiring structure. The first structure further includes a first vertical sidewall region. The device structure includes a second structure overlying at least the first structure. In a specific embodiment, the second structure includes a stack of material comprising a resistive switching material in physical and electrical contact with the junction material, an active metal material in physical and electrical contact with the resistive switching material, and a second wiring material in physical and electrical contact with the active metal material. The resistive switching material in the second structure includes a second vertical sidewall region free from a coincident region from the first vertical sidewall region in a specific embodiment.

Many benefits can be achieved by ways of present invention over conventional techniques. For example, the present method provides one or more device structures for forming a resistive switching device. These device structures are free from undesirable electrical connection between terminals for improved yield and enhanced device performance. The present device is characterized by low power consumption (operating voltage no greater than about 6 volts), high switching speed (in nanosecond range), and a high on-state current (Ion) to off-state current (Ioff) ratio (Ion to Ioff ratio greater than about $10^3$). These device properties are desirable for current and future demand for high density, high speed application in consumer electronics, and others. More than one device structures can be realized by ways of present invention for process flexibilities and device design flexibilities. Additionally, the present method uses conventional semiconductor processing techniques without modification to the equipments. Depending on the embodiment, one or more of these benefits may be realized.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 1 is a simplified diagram illustrating a resistive switching device for a non-volatile memory device according to an embodiment of the present invention;

FIG. 1A is a simplified diagram illustrating a resistive switching device comprising a conductor path according to an embodiment of the present invention;

FIGS. 2-16 are simplified diagrams illustrating a method for forming a resistive switching device for a non-volatile memory device according to various embodiments of the present invention;

DETAILED DESCRIPTION OF THE PRESENT INVENTION

Figure 5:
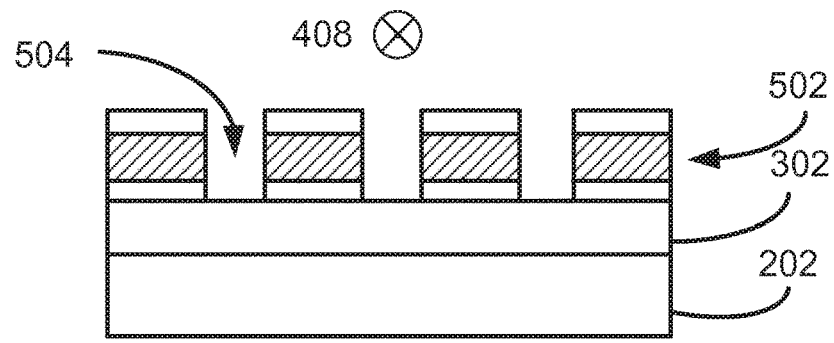

The present invention is generally related to resistive switching devices. More particularly, embodiments according to the present invention provide a device structure and a method to improve device performance of a resistive switching device The present invention can be applied to improving data retention characteristic of non-volatile memory devices, but it should be recognized that embodiments according to the present invention can have a much broader range of applicability Some embodiments of a resistive switching device include a two terminal device including a top electrode, a bottom electrode and a resistive switching material disposed between the top electrode and the bottom electrode. The resistive switching material is characterized by a resistance dependent on an electric field upon an application of a suitable voltage to one of the electrodes. The electric field causes a conductor path to form in the resistive switching material (e.g., see FIG. 1A). Depending on the electrode material and the resistive switching material used, the conductor path can be formed from the electrode material or defect path in the presence of the electric field. The conductor path determines the resistance of the resistive switching material. For example, for a metal oxide material as the switching material, the conductor path can form from oxygen deficient sites in the metal oxide. For a silicon material as the switching material, the conductor path can be formed from the electrode material, which comprises an active metal material. The resistive switching material is in a high conductance state. The conductor path is broken or retracts (e.g., a retractable conductive path; see FIG. 1A) when a reverse bias voltage is applied and causes the resistive switching material to be in a low conductance state. The resistance of the resistive switching material has a resistance depending on the voltage and provides for a multi-level or multi-bit device. Therefore, the conductor path structure needs to be stable under selected voltage, forward bias voltage, or reverse bias voltage for proper data retention.

Embodiments according to the present invention provide a device structure and a method for a resistive switching device characterized by a stable conductive path when a pre-determined voltage is applied and a reliable data retention characteristic for the device.

FIG. 1 is a simplified diagram illustrating a resistive switching device 100 according to an embodiment of the present invention. The resistive switching device includes a first electrode 102, a second electrode 106, and a resistive switching material 104 sandwiched between the first electrode and the second electrode.

In various embodiments, resistive switching device 100 is formed upon a semiconductor substrate (not shown). In certain embodiments, the semiconductor substrate can have one or more MOS devices formed thereon. The one or more MOS devices can be controlling circuitry for the resistive memory devices in specific embodiments. In other embodiments, the one or more MOS devices may include other functionality, such as a processor, logic, or the like.

In various embodiments, a processor, or the like, may include resistive memory memories as described herein. Because the resistive state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such resistive memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

In various embodiments, in FIG. 1, the first electrode 102 can be a first conductor material. The first electrode 102 can include a first conductive material such as a first metal material and/or a doped semiconductor material 112. In a specific embodiment, the first metal material 102 can be tungsten, aluminum, copper or other suitable metal that are compatible with CMOS fabrication techniques. In additional embodiments, a doped semiconductor material 112 may be p-doped polysilicon, p-doped silicon germanium, or the like. In some embodiments, doped semiconductor material 112 may include a lightly doped silicon containing lower layer that acts as a resistive layer, and a highly doped silicon containing upper layer that acts as a conductive layer. In one example, a p+ doped silicon germanium layer having a thickness of about 10-50 nm, e.g. 40 nm is on top of a p– doped silicon germanium layer having a thickness of about 50-100 nm, e.g. 50 nm. In a specific embodiment, the first electrode is elongated in shape and configured to extend in a first direction 108.

The resistive switching material 104 can include a suitable insulator material having a resistance that can be altered upon application of an electric field to the insulator material. In a specific embodiment, the resistive switching material 104 can include a silicon material. For example, the silicon material can be an amorphous silicon material, a microcrystalline silicon material, a macro crystalline silicon material, a silicon germanium material, a silicon oxide including any combination of these. In a various embodiments, the silicon material includes an amorphous silicon material and a silicon oxide material.

The resistive switching material 104 is characterized by a state, for example, a resistance state dependent on an electric field in the switching material. In a specific embodiment, the switching material is an amorphous silicon material. The amorphous silicon material has essentially intrinsic semiconductor characteristic and is not intentionally doped in a specific embodiment. In various embodiments, the amorphous silicon is also referred to as non-crystalline silicon (nc-Si). nc-Si non-volatile resistive switching devices may be fabricated using existing CMOS technologies. In an exemplary process, a mixture of silane (SiH4)(45 sccm) and Helium (He) (500 sccm) is used to form an a-Si layer with a deposition rate of 80 nm per minute (T=260° C., P=600 mTorr) during PECVD. In another exemplary process, a mixture of silane (SiH4)(190 sccm) and Helium (He) (100 sccm) is used to form an a-Si layer with a deposition rate of 2.8 A per second (T=380° C., P=2.2 Torr) during PECVD. In another exemplary process, silane (SiH4 80 sccm) or disilane is used to form an a-Si layer with a deposition rate of 2.8 nm per minute (T=585° C., P=100 mTorr) during LPCVD. Portions of poly-silicon grains may form during the LPCVD process and result in an amorphous-poly silicon film. In various embodiments, no p-type, n-type, or metallic impurities are intentionally added to the deposition chamber while forming the amorphous silicon material. Accordingly, when deposited, the amorphous silicon material is substantially free of any p-type, n-type or metallic dopants, i.e. the amorphous silicon material is undoped. A thin oxide may be formed above the amorphous silicon material, and be useful for switching purposes.

In yet another embodiment, the switching material 104, e.g. amorphous silicon material (and/or silicon oxide) 104 may be formed from an upper region of a p+ polycrystalline silicon or p+ silicon germanium bearing layer (e.g. 112) using an Argon, Silicon, Oxygen plasma etch, or the like. For instance, a plasma etch may use a bias power within a range of approximately 30 watts to approximately 120 watts to convert an upper region of the polysilicon or silicon germanium material into a non-conductive amorphous silicon having p-type impurities and/or a native silicon oxide (from the original polycrystalline silicon or silicon germanium bearing layer 112). In some embodiments, the silicon oxide may be SiOx, a sub-oxide. In some embodiments, switching layer may be on the order of 1 to 5 nm, e.g. 4 nm.

The second electrode 106 can be a second conductor material and can have a portion that includes a second metal material. The second metal material can be selected from aluminum, nickel, silver, gold, palladium, platinum, and others. The second metal material may have a suitable diffusivity in the switching material in a specific embodiment. In a specific embodiment, the second electrode is elongated in shape and configured to extend in a second direction 110 orthogonal to the first direction 108. In a specific embodiment, the second metal material includes a silver material.

As mentioned above, in certain embodiments, the resistive switching device 100 can include a contact material (112) disposed between the metal material of the first electrode 102 and the resistive switching layer 104. In some embodiments, the contact material 112 provides a suitable interfacial defect characteristic for desirable switching behavior for the switching device 100. For amorphous silicon material as the switching material 104, the contact material 112 can be p+ polysilicon or p+ silicon germanium material. In certain embodiments, the contact material 112 can be optional.

In various embodiments, additional interposing layer(s) 114 may be disposed between resistive switching material 104 and second electrode 106. The additional layer 114 may include a material that has non-noble metal properties, e.g. the material oxidizes in the presence of oxygen. In some examples, the additional layer 114 may be titanium, titanium nitride, tungsten, tungsten nitride, or the like. In various embodiments, additional layer 114 may serve as an adhesion and/or barrier layer between resistive switching material 104 and second electrode 106. In various embodiments, additional layer(s) 114 may be used to enhance retention, as will be described below. In some examples, the interposing layer is titanium/titanium oxide, and may be on the order of 1 to 5 nm, e.g. 2 nm.

In various embodiments, multiple resistive switching devices 100 can be disposed in an N by M crossbar array to form a high density interconnected array of non-volatile memory cells. A more detailed description of examples of a fabrication process are illustrated below.

As shown in FIG. 2, a semiconductor substrate 202 having a surface region 204 is provided. Semiconductor substrate 202 can be a single crystal silicon wafer, a silicon germanium material, a silicon on insulator (commonly called SOI) depending on the embodiment. In certain embodiments, semiconductor substrate 202 can have one or more MOS devices formed thereon or therein. The one or more MOS devices can be controlling circuitry for the resistive switching device, or the like in some embodiments.

In various embodiments, a processor, or the like, may include resistive memory memories as described herein. Because the resistive state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such resistive memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like. Additionally, in various embodiments, multiple layers of memory cells (e.g. first and second conductors, resistive switching layers, etc. as illustrated in FIG. 1) may be fabricated in various embodiments, greatly increasing memory density for such processors, devices, or the like.

As illustrated in FIG. 3, embodiments of the method include depositing a first dielectric material 302 overlying the semiconductor substrate 202. First dielectric material 302 can be silicon oxide, silicon nitride, a dielectric stack of alternating layers of silicon oxide and silicon nitride (for example, an ONO stack), a low K dielectric, a high K dielectric, or a combination, and others, depending on the application. First dielectric material 302 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

Referring to FIG. 4, embodiments of the method include depositing a first wiring material 402 overlying the first dielectric material. First wiring material 402 can be a suitable metal material including alloy materials, or a semiconductor material having a suitable conductivity characteristic. In some embodiments, the metal material can be tungsten, aluminum, copper or silver, and others. In some embodiments, the first wiring material may be a combination of conductive materials. In various embodiments, these metal materials may be deposited using a physical vapor deposition process, chemical vapor deposition process, electroplating, or electrodeless deposition process, a combinations of these, and others. In some embodiments, the semiconductor material can be, for example, a p-type doped silicon material, a conductive polysilicon, or the like.

In certain embodiments, a first adhesion material 404 is first formed overlying the first dielectric material 402 before deposition of the first wiring material 402 to promote adhesion of the first wiring material 402 to the first dielectric material 302. A diffusion barrier material 406 may also be formed overlying the first wiring material 402 to prevent, for example, the conductive material, the metal material, gasses, oxygen, or the like to contaminate other portions of the device in a specific embodiment.

In FIG. 5, an embodiment of the method subjects the first wiring material (302, 404 and 406) to a first pattern and etching process to form a first wiring structure 502 in a specific embodiment, while exposing a portion 504 of first dielectric material 302. As shown in FIG. 5, the first wiring structure 502 includes a plurality of first elongated structures configured to extend in a first direction 408 (into and out of the page) in a specific embodiment.

Figure 6:
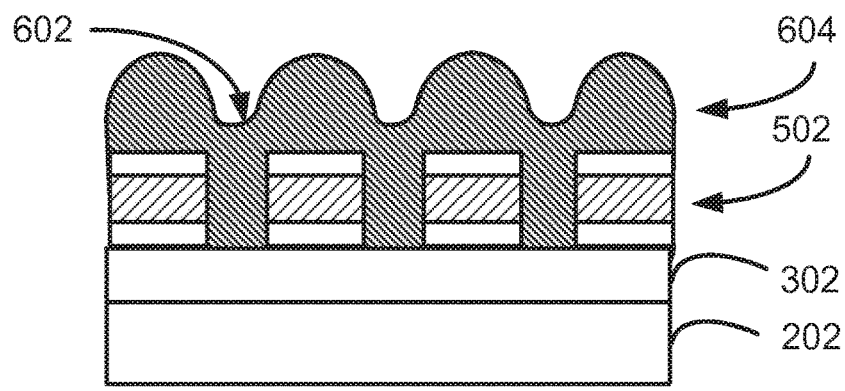

Referring to FIG. 6, a second dielectric material 602 is formed overlying the one or more first wiring structure and to fill a gap between the one or more first wiring structures 502 to isolate the one or more first wiring structures 502. Second dielectric material 602 further forms a thickness 604 overlying the first wiring structure 502 in a specific embodiment. Second dielectric material 602 can be silicon oxide, silicon nitride, silicon oxynitride, a high K dielectric, a low K dielectric, or a dielectric stack having alternating layer of silicon oxide and silicon nitride (for example an ONO stack), including any combination of these, and others. Second dielectric material 602 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, including any combination of these, and others.

In some embodiments, prior to forming second dielectric material 602 a thin layer of material may be deposited to protect the side walls of first wiring structure 502 from contaminants, such as oxygen. In some embodiments, titanium, titanium nitride, silicon nitride, or the like may be used.

Figure 7:
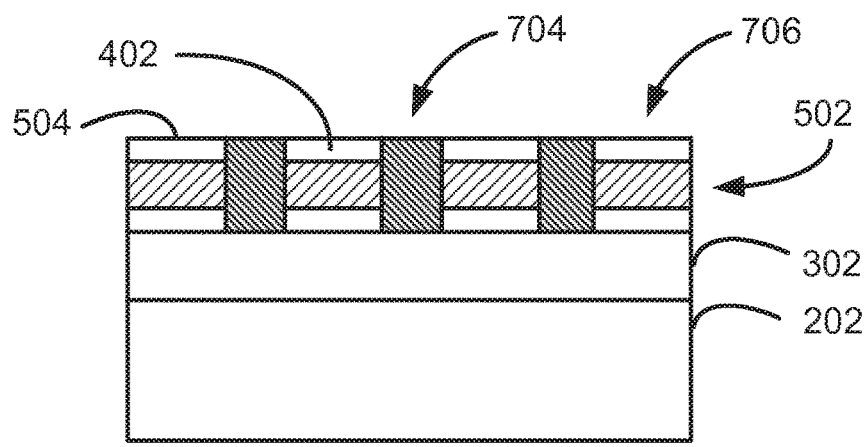

In various embodiments, the second dielectric material 604 is subjected to a planarizing process to form a planarized dielectric surface 704 and to expose a surface region 706 of the first wiring structure 502, as shown in FIG. 7. Planarizing process can be a chemical mechanical polishing (CMP) process, or an etch back process, or a combination depending on the embodiment.

Figure 8:
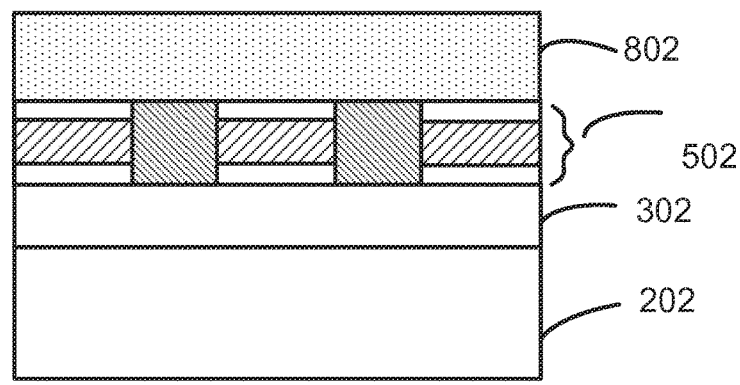

In a specific embodiment, a junction material 802 is deposited overlying the exposed surface region of the first wiring structure and the planarized surface of the second dielectric material, as illustrated in FIG. 8. Junction material 802 can be a p-doped silicon material. In a specific embodiment, the p-doped silicon material is a polysilicon having a p+ impurity characteristic. Depending on the application, the p+ impurity can be provided using boron, aluminum, gallium, indium, and other suitable p type impurity species. Again depending on the implementation, the polycrystalline silicon material may be deposited using techniques such as chemical vapor deposition including low pressure chemical vapor deposition, plasma enhanced chemical vapor deposition, atomic layer deposition, and others. Silicon precursors such as silane, a suitable chlorosilane in a presence of a reducing gas (for example, hydrogen) may be used. In other embodiments, the polycrystalline silicon material may be deposited using a physical vapor deposition technique from a suitable silicon target material. The p+ type impurity species can be co-deposited during deposition process (chemical vapor deposition or physical vapor deposition) or using an implantation process after deposition. Junction material 802 can be other suitable semiconductor material in a specific embodiment.

In various embodiments, the junction material 802 can be doped silicon germanium (poly-SiGe) material. In various embodiments, the silicon germanium material can be doped with a suitable impurity species to have a desirable conductivity, e.g. p+. The silicon germanium material can be deposited using a chemical vapor deposition process such as a low pressure chemical vapor deposition process, a plasma enhanced chemical vapor deposition process, atomic layer deposition (ALD) and others. Depending on the application, precursors such as silane and germane in a suitable carrier gas may be used. The silicon germanium material can have a p+ impurity characteristic provided by dopants such as boron, aluminum, gallium, indium, and others. Deposition temperature can range from about 400 Degree Celsius to about 490 Degree Celsius and the as deposited silicon germanium material is crystalline and has a desirable conductivity characteristic, without further anneal. Other deposition methods may also be used depending on the embodiment.

In various embodiments, as mentioned above, the junction material 802 may be composed of two or more layers of material. In one example, a highly doped layer of silicon bearing material may be disposed upon a lightly doped layer of silicon bearing material. These layers may be formed by increasing the dopant concentration during the formation of junction material 802. In some embodiments, an upper region may be a p+ silicon germanium layer, and a lower region may be a p− silicon germanium layer. It is believed that the upper region acts more like a conductor, and the lower region acts more like a resistive layer.

Depending on the application, a seed layer material may be formed overlying the first wiring material before deposition of the junction material. The seed layer material can include a thin layer of silicon material (about 40 Angstrom to about 120 Angstroms) deposited at temperatures no greater than about 430 Degree Celsius (for example, about 250 Degree Celsius to about 450 Degree Celsius) to promote crystallization of junction material 802.

Figure 9:
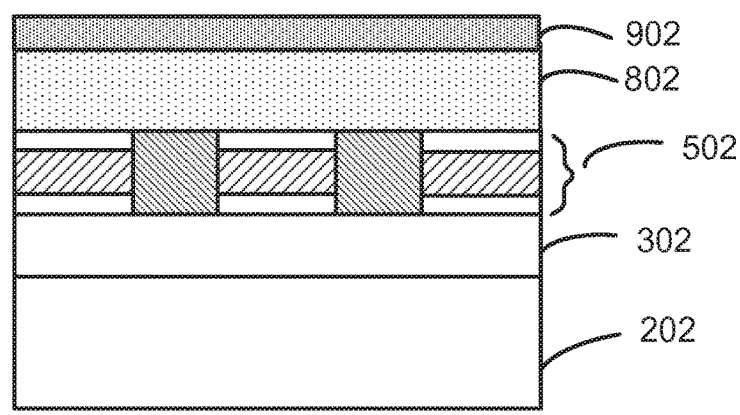
Figure 10:
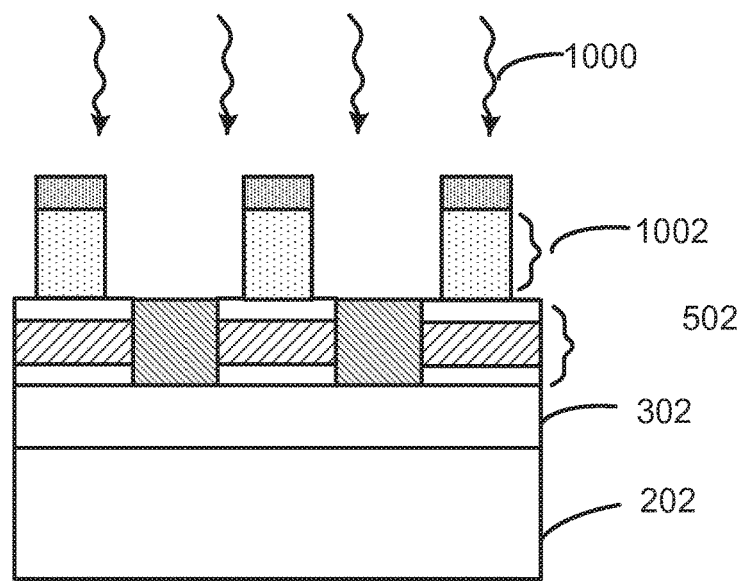

As shown in FIG. 9, a hardmask material 902 is deposited overlying the junction material 802. Hardmask material 902 can be a dielectric material, for example, silicon oxide, silicon nitride, silicon oxynitride, alternating layers of silicon oxide and silicon nitride (for example, ONO) and others. Hardmask material and the junction material are subjected to a pattern and etch process 1000 to form a plurality of first structures 1002 as illustrated in FIG. 10. In various embodiments, each of the plurality of first structures 1002 is configured overlying and in electrical and physical contact with the first wiring structure, as shown.

Figure 11:
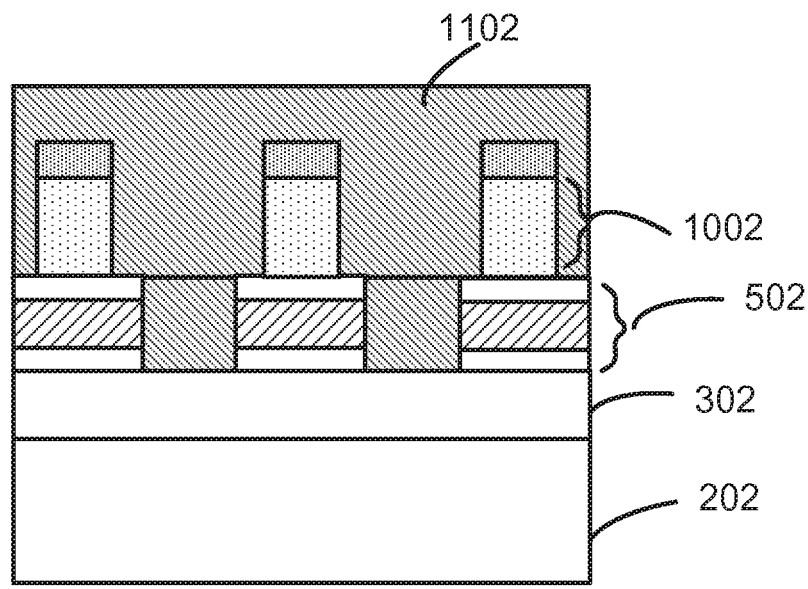

Referring now to FIG. 11, the method includes depositing a third dielectric material 1102 overlying the plurality of first structures 1002 and filling a gap between each of the plurality of first structures 1002. The third dielectric material may be silicon oxide, silicon nitride, silicon oxynitride, and others. In certain implementations, third dielectric material is silicon oxide deposited using techniques such as chemical vapor deposition process, including plasma enhanced chemical vapor deposition process, low pressure chemical vapor deposition process, sub atmospheric chemical vapor deposition process, and others.

Figure 12:
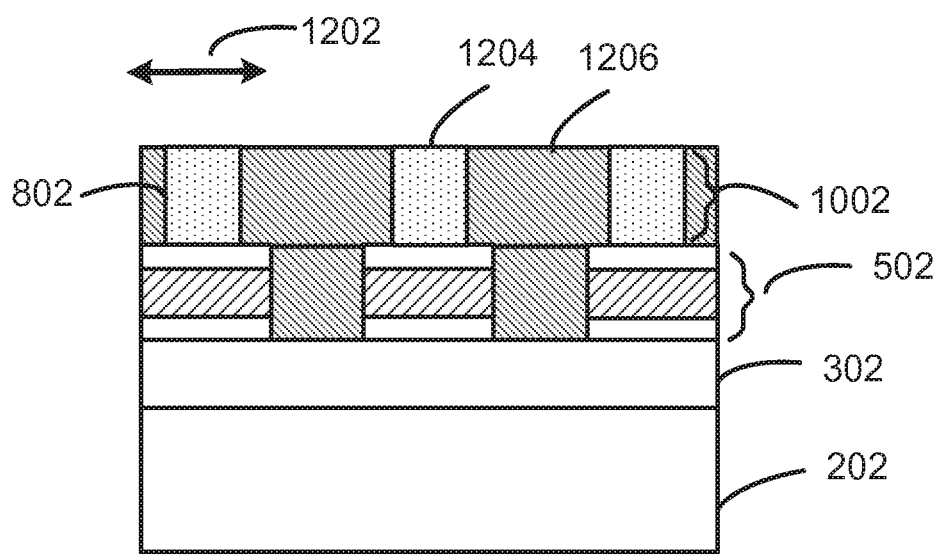
Figure 13:
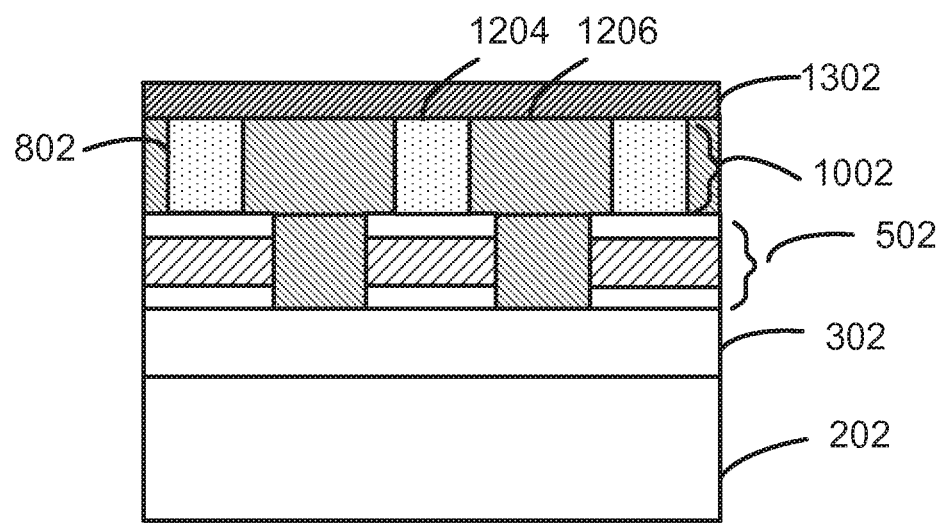

As seen in FIG. 12, in various embodiments, third dielectric material 1102 is then subjected to a planarizing process 1202 to expose a top surface region 1204 of the first structure 1002. Top surface region 1204 includes a top surface region of junction material 802 in a specific embodiment. Depending on the implementation, planarizing process 1202 can remove a portion of junction material 802. In some embodiments, deposition thickness of junction material 802 may have to account for the removal of the top surface region.

In a specific embodiment, the method includes forming a resistive switching material 1302 overlying top surface region of the first structure, including top surface region 1204 of junction material 802 and the exposed surface 1206 of third dielectric material 1102. Depending on the application, the top surface region 1204 of the junction material 802 may be subjecting to a cleaning step to remove contaminants from the planarizing process, and others.

In various embodiments, the resistive switching material 1302 includes an amorphous silicon material having an intrinsic semiconductor characteristic. The amorphous silicon material can be formed using a chemical vapor deposition process such as low pressure chemical vapor deposition process, plasma enhanced chemical vapor deposition process, and others. The chemical vapor deposition process can use silicon precursor such as silane, a suitable chlorosilane in presence of a reducing species (for example, hydrogen), and others. In some embodiments, the deposited amorphous silicon is not intentionally doped to maintain the intrinsic semiconductor characteristic during deposition or after deposition in a specific embodiment. Deposition temperature ranges from about 250 Degree Celsius to about 400 Degree Celsius depending on the implementation.

In other embodiments, as mentioned above, the top surface region 1204 of junction material 802 may be subject to a plasma cleaning/etching process using Argon, oxygen, or the like, for example. In some embodiments, this process may be useful for removing contaminants from the planarization process 1202. In some embodiments, the process also amorphizes an upper region of junction material 802. For example, the process changes a portion of a p+ silicon germanium region to a non-conductive amorphous region, including silicon, p type impurities, germanium, oxygen, and the like. In some examples, a silicon sub-oxide is formed. In some embodiments, this non-conductive amorphized layer may serve as the resistive switching material 1302. In various embodiments, the resistive switching material 1302 may only be formed overlying junction material 802.

Figure 14:
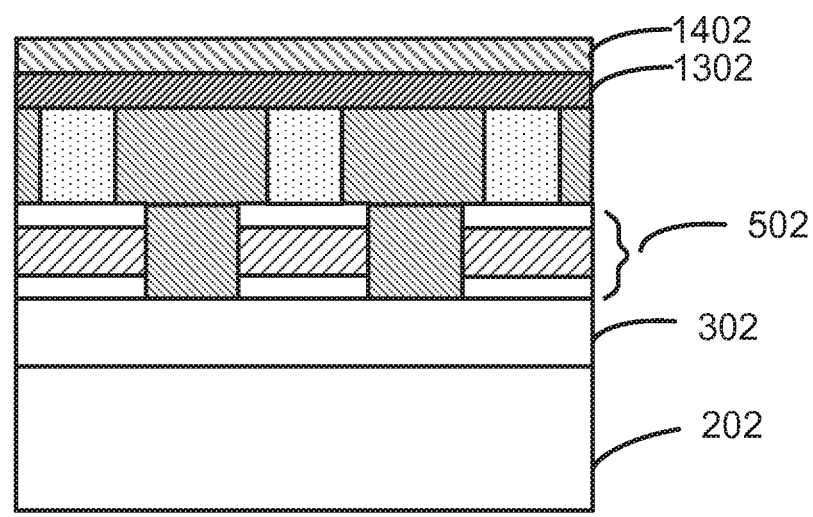

Referring to FIG. 14, the method includes depositing an active metal material 1402 overlying the resistive switching material 1302. In various embodiments, when resistive switching material 1302 is amorphous silicon material, or the amorphized layer formed above, active metal material 1402 can be selected from silver, gold, palladium, platinum, aluminum, chromium, vanadium, and others. In some embodiments, the active metal material is selected to have a desirable diffusivity characteristic in resistive switching material 1302 in a presence of a suitable electric field.

In some embodiments, the active metal material 1402 is silver. Silver is sometimes deposited at a temperature no greater than about 250 Degree Celsius to inhibit mass diffusion of silver into the resistive switching material 1302. In some embodiments, a layer of titanium is deposited above resistive switching material 1302, prior to depositing active metal material 1402. In some embodiments, active metal material 1402 helps to protect resistive switching material 1302 from subsequent processing steps, or other variation.

In a specific embodiment, in operation, when a positive voltage greater than a threshold voltage applied to the active metal material 1402 with respect to the first wiring structure 502 causes the active metal material to migrate into a portion of the resistive switching layer 1302 to cause the material to change from a high resistance state into a low resistance state (or on state) and an on-state current flows.

Figure 15:
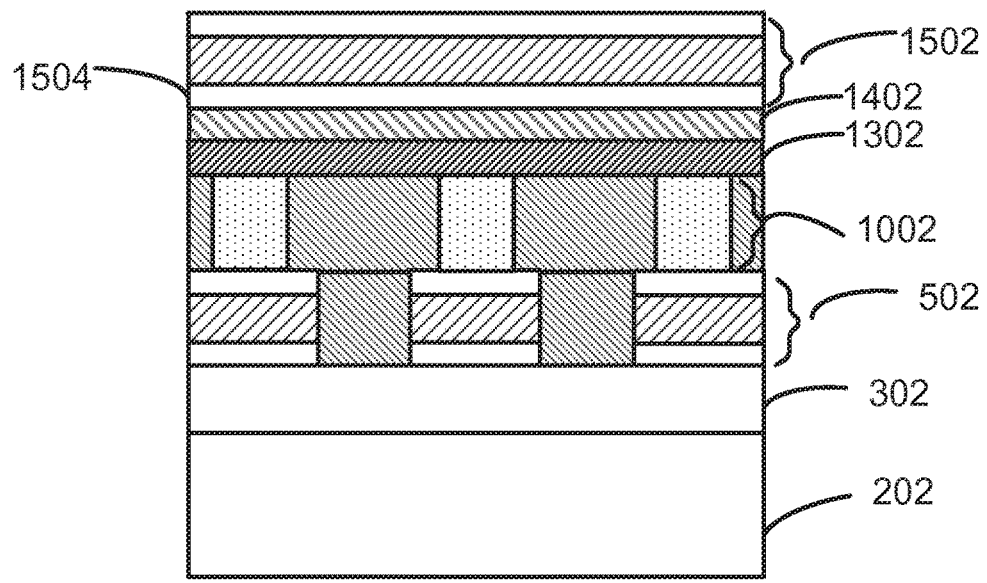
Figure 16:
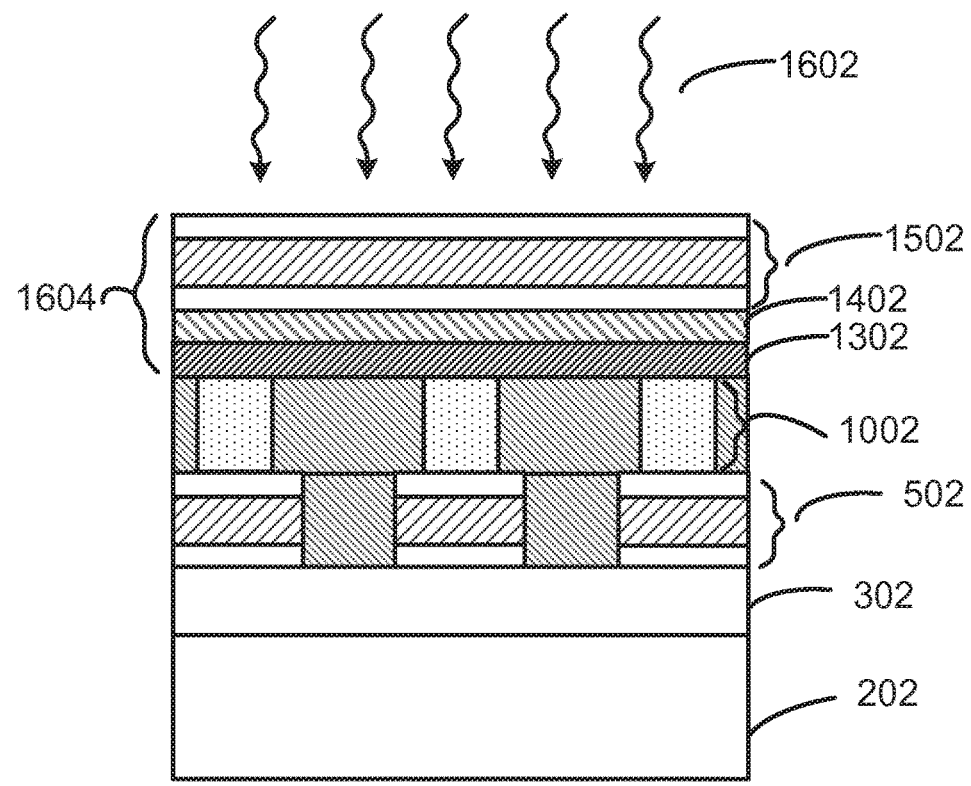

As shown in FIG. 15, the method includes forming a second wiring material 1502 overlying active metal material 1402. Second wiring material 1502 can be copper, tungsten, or aluminum depending on the application. Depending on the implementation, the active metal material 1402 (for example, silver) may also serve as the second wiring material 1502. The second wiring material 1502 can further include one or more diffusion barrier layer material and/or adhesion materials to promote adhesion of the second wiring material 1502 to the second dielectric material 1206 and the active metal material 1402. The one or more diffusion barrier material and/or adhesion materials may further inhibit diffusion of the active metal material 1402 (e.g. silver) to prevent contamination to other parts of the device. Again depending on the implementation, the one or more diffusion barrier and/or adhesion materials can include titanium, titanium nitride, tungsten, titanium tungsten, tungsten, or a combination, and others.

In various embodiments, a diffusion barrier and/or adhesion material layer 1504 may be formed immediately after active metal material 1402 is deposited. This may be done, for example, in situ—within the same chamber, after active metal material 1402 (e.g. silver) is deposited, layer 1504 (e.g. titanium) is then deposited. Such embodiments may be useful to reduce the active metal material 1402 from contaminating subsequent processes, and/or may be useful to reduce undesirable changes to resistive switching material 1302. In some embodiments, this may be combined with a titanium layer (for example) being deposited immediately or close in time after resistive switching material 1302 is formed, and before active metal material 1402 is deposited.

In a specific embodiment, the method subjects a stack of material including the resistive switching material 1302, active metal material 1402, and second wiring material 1502 (including barrier and/or adhesion layers) to a third pattern and etch process 1602 to form a plurality of second structures 1604. Second structures 1604 including resistive switching material 1302, active metal material 1402, and second wiring material 1502 are typically configured to spatially extend in a second direction orthogonal to the first direction in certain embodiments.

In some embodiments wherein resistive switching material 1302 is formed as a result of an amorphizing etch (e.g. argon, oxygen), resistive switching material may be located at the intersections of second structures 1604 and first wiring structures 502.

FIGS. 17-20 illustrate various embodiments of a width of resistive switching material 1302 relative to pillar-like structure 1002, and/or with regards to active metal material 1402. Briefly, in FIG. 17, a width of resistive switching material 1302 may be substantially similar to a width of active metal material 1402 and second wiring material 1502; in FIG. 18, a width of resistive switching material 1302 may be between a width of active metal material 1402 and a width of pillar-like structure 1002; in FIG. 19, a width of resistive switching material 1302 and a width of active metal material 1402 may be substantially similar but different from a width of pillar-like structure 1002; and in FIG. 20, a width of resistive switching material 1302 may be substantially similar to a width of pillar-like structure 1002. In light of the present disclosure, one of ordinary skill in the art will recognize that in other embodiments, other combinations and permutation of widths are also taught. In FIGS. 17-20, like references are used in the following and throughout the present disclosure and should not be construed to be limiting.

Figure 17:
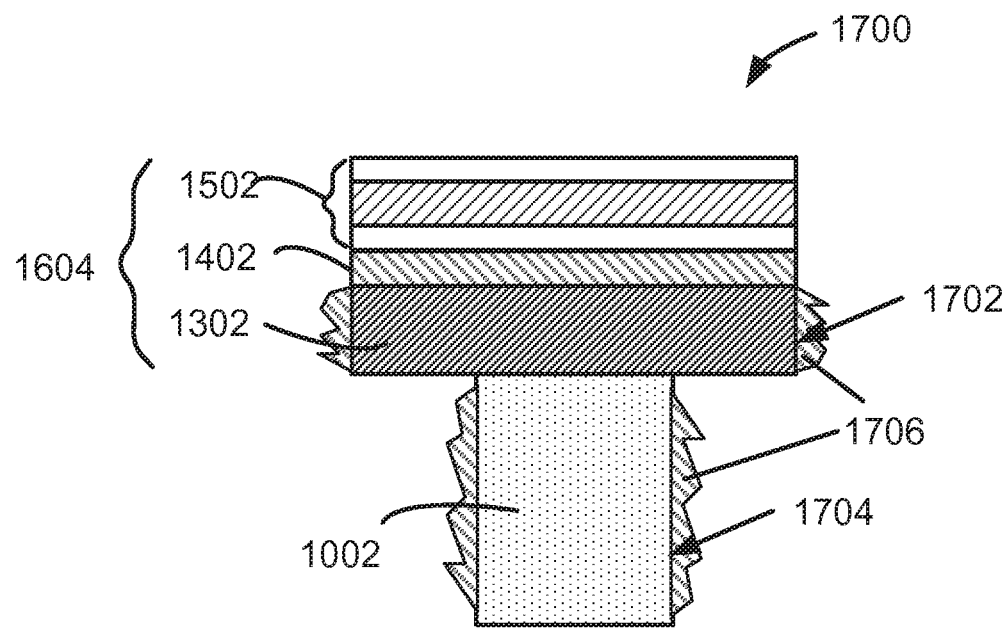
FIGS. 17-19 are simplified diagrams illustrating various partial device structures according to various embodiments of the present invention.

Referring to FIG. 17, a partial view of a resistive switching device 1700 according to various embodiments of the present invention is illustrated. Resistive switching device 1700 can be fabricated according to process steps as illustrated in FIGS. 2-16. As shown, resistive switching device 1700 includes first pillar-like structure 1002 comprising the junction material (for example, p+ polysilicon material; p+ polysilicon germanium material, or p+ SiGe/p-SiGe). First structure includes a first vertical region 1704. Resistive switching device 1700 further includes a second structure 1604. Second structure 1604 includes the resistive switching material 1302, active metal material 1402, and second wiring material configured as a stack of material, as shown. Second structure 1604 includes a common second vertical sidewall region 1702. As shown, first vertical sidewall region 1704 and second vertical sidewall region 1702 are free of a common vertical sidewall or a coincident vertical sidewall region. Contaminants 1706, especially conductive contaminants, on first vertical sidewall region 1704 or second vertical sidewall region 1706 may prevent an appropriate electrical connection between active metal material 1402 and the first wiring structure. 502

Figure 18:
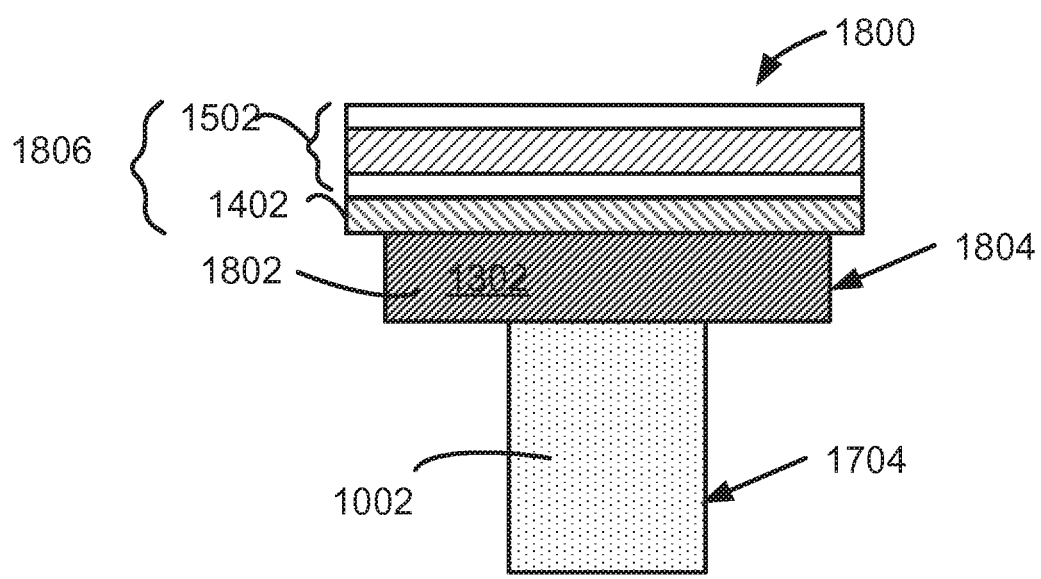

Depending on the implementation, there can be other variations. As shown in FIG. 18, the resistive switching material 1302 can form a resistive switching element 1802 overlying the first structure 1002. Resistive switching element 1802 is configured such that a second vertical side wall region 1804 is free from a common vertical side wall region with the first vertical side wall region 1704 associated with the junction material. Depending on the implementation, resistive switching element 1802 can be configured as a pillar structure having a cross sectional area no less than a cross sectional area of first structure 1704, as illustrated. Alternatively, resistive switching element 1802 can have a cross sectional area no greater than a cross sectional area of the first structure 1002. The method can form a dielectric material overlying resistive switching element 1802 to isolate the resistive switching elements 1802 in a specific embodiment. An active metal material 1402 is deposited overlying resistive switching material 1802 and a wiring material 1302 is deposited overlying the active metal material 1402. The method can form a structure from a second stack of material 1806 including the active metal material 1402 and the second wiring material 1502 in certain embodiments.

Figure 19:
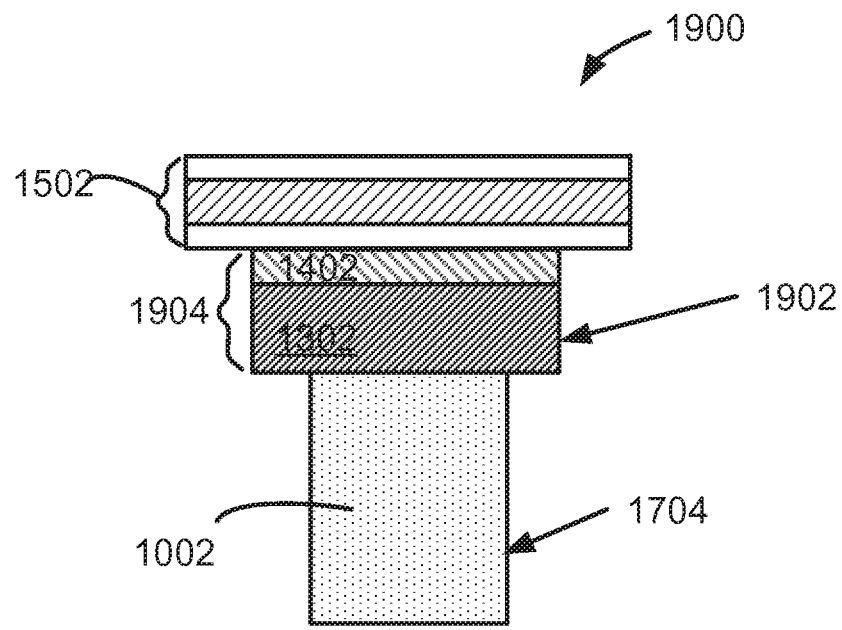

As shown in FIG. 19, the method can from a third structure 1904 including resistive switching material 1302 and active metal material 1402 overlying first structure 1002 associated with the junction material in another implementation. Third structure 1904 can be configured as a pillar structure in certain implementation. Again third structure 1904 is configured such that resistive switching material 1302 and junction material 1002 do not share a common side wall region or a coincident region, as shown in FIG. 19.

In a specific embodiment, a resistive switching device for a non-volatile memory device is provided. The resistive switching device includes a substrate having a surface region. In certain embodiments, the substrate can include one or more transistor device formed thereon. The one or more transistor device provides a circuitry for controlling operations of the resistive switching device. The resistive switching device includes a first dielectric material overlying the substrate and a first wiring structure overlying the first dielectric material. The first wiring structure can include a metal material or a semiconductor material configured to spatially extend in a first direction. The resistive switching device includes a first structure comprising a junction material overlying and in physical and electrical contact with the first wiring structure. In a specific embodiment, the first structure is configured as a pillar structure. The resistive switching device includes a second dielectric material filling the gaps between the first structures and isolate each of the first structures in certain implementation. The resistive switching device includes a second structure overlying the first structure. The second structure includes a stack of materials comprising a resistive switching material, an active metal material, and a second wiring material. In certain implementations, the first structure and the second structure are each elongated in shape and spatially configured perpendicular to each other. The active metal material, the resistive switching material, and the junction material form a resistive switching device in a specific embodiment. In certain implementation, the junction material includes a p+ polycrystalline silicon material. In another implementation, the junction material includes a p+ polycrystalline silicon germanium material. The resistive switching material includes an amorphous silicon material having an intrinsic semiconductor characteristic in a specific embodiment. For amorphous silicon as the resistive switching material, the active metal material can be selected from silver, gold, palladium, nickel, copper, aluminum, and others. The first structure and the second structure are configured such that the junction material and the resistive switching material are free from a common vertical side wall region. Depending on the application, the first wiring material and the second wiring material can each include a metal material and one or more diffusion barrier material. Alternatively, the first wiring material and the second wiring material can each include a doped semiconductor material.

Depending on the implementation, various device structures may be realized. For example, an alternative device structure can have a third structure including the resistive switching material overlying the first structure. The third structure and the first structure are free from a common vertical sidewall region, as shown in FIG. 18.

Yet alternatively, a fourth structure including the resistive switching material and the active metal material may be disposed overlying the first structure, wherein the resistive switching material and the junction material are free from a common sidewall region, as shown in FIG. 19. The second wiring structure is configured in a second direction orthogonal to the first direction of the first wiring structure.

Figure 20:
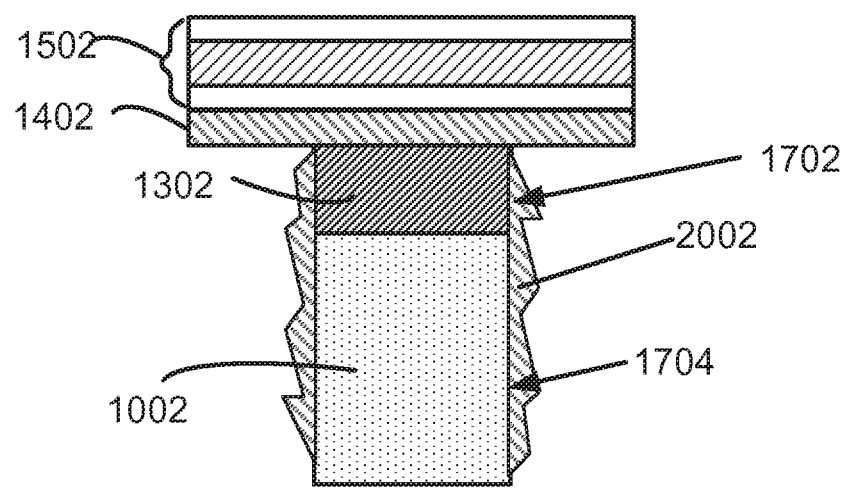
FIG. 20 is a simplified diagram illustrating an example of an undesirable device structure.

FIG. 20 illustrates a resistive switching device where first side wall region 1702 associated with the resistive switching material 1302 shares a common side wall region with second sidewall region 1704 associated with junction material 1002. Contaminant material 2002 would cause electrical connection between second electrode 1402 and first electrodes 502 (not shown) rendering the device defective.

Though the present invention has been exemplified in various embodiments, it is to be understood that the examples and embodiment described herein are for illustrative purpose only and that various modifications or alternatives in light thereof will be suggested to persons skilled in the art and are to be included within the spirit and purview of this application and scope of the appended claims.

What is claimed is:

1. A resistive switching device comprising:
a substrate having a surface region;
a first dielectric material layer overlying the surface region of the substrate;
a first wiring structure comprising a first metal material overlying the first dielectric material layer;
a plurality of first structures overlying a surface region of the first wiring structure, wherein the plurality of first structures comprise a contact material, wherein the plurality of first structures are separated by a second dielectric material, and wherein the plurality of first structures are characterized by a first width;
a plurality of resistive switching material structures overlying the plurality of first structures, wherein each resistive switching material structure from the plurality of resistive switching material structures is characterized by a second width, wherein the plurality of resistive switching material structures comprise undoped silicon material;
a plurality of active conductive material structures overlying the plurality of resistive switching material structures, wherein each active conductive material structure from the plurality of active conductive material structures is characterized by a third width, wherein the plurality of active conductive material structures comprise an active metal material; and
a second wiring structure overlying the plurality of active conductive material structures;
wherein the plurality of first structures, the plurality of resistive switching material structures and the plurality of active conductive material structures form a plurality of non-volatile memory cells;
wherein a resistive switching material structure of a non-volatile memory cell from the plurality of non-volatile memory cells includes a conductive path disposed therein comprising a portion of the active metal material from an active conductive material structure from the plurality of active conductive material structures; and
wherein a resistance of the non-volatile memory cell is determined in response to a conductance state of the conductive path.

2. The device of claim 1 wherein the first width is less than the second width.

3. The device of claim 2 wherein the third width and the second width are substantially similar.

4. The device of claim 3 wherein the plurality of first structures comprise a plurality of pillars of the contact material, wherein the contact material separates the undoped silicon material from the first metal material.

5. The device of claim 3 wherein the undoped silicon material is selected from a group consisting of: undoped amorphous silicon, SiOx, a non-stoichiometric silicon oxide, a non-stoichiometric silicon compound and a non-conductive silicon containing material.

6. The device of claim 3 wherein the active metal material is selected from a group consisting of: aluminum, palladium and platinum.

7. The device of claim 3
further comprising a barrier material disposed between the plurality of active conductive material structures and a metal material of the second wiring structure;
wherein the barrier material is selected from a group consisting of: titanium containing material, titanium nitride, titanium tungsten, titanium, tantalum, tantalum nitride, and tungsten nitride; and
wherein the metal material is selected from a second group consisting of: copper and aluminum.

8. The device of claim 3 wherein the active metal material is selected from a group consisting of: silver, palladium and platinum.

9. The device of claim 1 wherein the plurality of resistive switching material structures and the plurality of active conductive material structures form a plurality of pillar structures.

10. A semiconductor device comprising:
a semiconductor substrate having a surface region;
a plurality of metal oxide semiconductor (MOS) devices formed upon the semiconductor substrate;
a first dielectric material layer disposed above the surface region of the semiconductor substrate;
a first wiring structure disposed above the first dielectric material layer comprising a first metal material;
a contact structure overlying a surface region of the first wiring structure, wherein the contact structure comprises a contact material, wherein the contact structure comprises a pillar characterized by a first width;
a second dielectric material layer disposed surrounding the contact structure, wherein a top surface region of the second dielectric material layer and a top surface region of the contact structure are substantially coplanar;
a resistive switching material structure overlying the surface region of the contact structure, wherein the resistive switching material structure comprises a pillar characterized by a second width, wherein the resistive switching material structure comprises undoped silicon material;
an active conductive material structure overlying the resistive switching material structure, wherein the active conductive material structure comprises a pillar characterized by a third width, wherein the active conductive material structure comprises an active metal material;
and
a second wiring structure disposed above a top surface region of the active conductive material structure comprising a second metal material;
wherein the contact structure, the resistive switching material structure and the active conductive material structure form a non-volatile memory cell;

wherein the resistive switching material structure includes a conductive path disposed therein comprising a portion of the active metal material from the active conductive material structure; and wherein a resistance of the non-volatile memory cell is modified in response to the conductive path.

11. The semiconductor device of claim 10 further comprising:
circuitry formed upon the semiconductor substrate comprising the plurality of MOS devices;
wherein the circuitry is coupled to the non-volatile memory cell.

12. The semiconductor device of claim 11 wherein the circuitry is selected from a group consisting of: control circuitry for the non-volatile memory cell, a processor, and logic.

13. The semiconductor device of claim 10 wherein the first width is less than the second width and wherein the third width and the second width are substantially similar.

14. The semiconductor device of claim 13 wherein the contact structure comprises a pillar of contact material separating the undoped silicon material from the first metal material.

15. The semiconductor device of claim 13 wherein:
the undoped silicon material is selected from a group consisting of: undoped amorphous silicon, SiOx, a non-stoichiometric silicon oxide, a non-stoichiometric silicon compound, and a non-conductive silicon containing material; and
the active metal material is selected from a second group consisting of: aluminum, palladium and platinum.

16. The semiconductor device of claim 13
further comprising a barrier material disposed between the active conductive material structure and the second metal material;
wherein the barrier material is selected from a group consisting of: titanium containing material, titanium nitride, titanium tungsten, titanium, tantalum, tantalum nitride, and tungsten nitride; and
wherein the second metal material is selected from a group consisting of: copper and aluminum.

17. The semiconductor device of claim 13 wherein the active metal material is selected from a group consisting of: silver, palladium and platinum.

18. A semiconductor device comprising:
a semiconductor substrate having a surface region;
a plurality of metal oxide semiconductor (MOS) devices formed upon the semiconductor substrate;
a first dielectric material layer disposed above the surface region of the semiconductor substrate;
a first number, M, of first wiring structures disposed above the first dielectric material layer comprising a first metal material, where M is an integer greater than zero;
a plurality of contact structures overlying portions of surface regions of the M first wiring structures, wherein the plurality of contact structures comprise a contact material, wherein the plurality of contact structures comprise pillars characterized by a first width;
a second dielectric material layer disposed between and surrounding the plurality of contact structures, wherein a top surface region of the second dielectric material layer and top surface regions of the plurality of contact structures are substantially co-planar;
a plurality of resistive switching material structures overlying top surface regions of the plurality of contact structures, wherein the plurality of resistive switching material structures comprise pillars characterized by a second width, wherein the plurality of resistive switching material structures comprise undoped silicon material;
a plurality of active conductive material structures overlying the plurality of resistive switching material structures, wherein the plurality of active conductive material structures comprise pillars characterized by a third width, wherein the plurality of active conductive material structures comprise an active metal material; and
a second number, N, second wiring structures disposed above top surface regions of the plurality of active conductive material structures comprising a second metal material, where N is a second integer greater than zero;
wherein the plurality of contact structures, the plurality of resistive switching material structures and the plurality of active conductive material structures form N×M non-volatile memory cells;
wherein a resistive switching material structure from the plurality of resistive switching material structures includes a conductive path disposed therein comprising a portion of the active metal material from an active conductive material structure, from the plurality of active conductive material structures, that is disposed above the resistive switching material structure; and
wherein a resistance of the resistive switching material structure is modified in response to the conductive path.

19. The semiconductor device of claim 18
wherein the first width is less than the second width;
wherein the third width and the second width are substantially similar;
wherein the plurality of contact structures comprise pillars of contact material separating undoped silicon material of the plurality of resistive switching material structures from first metal material of the M first wiring structures;
wherein the undoped silicon material is selected from a group consisting of: undoped amorphous silicon, SiOx, a non-stoichometric silicon oxide, a non-stoichometric silicon compound, a non-conductive silicon containing material; and
wherein the active metal material is selected from a group consisting of: aluminum, palladium, platinum.

20. The semiconductor device of claim 18
further comprising a barrier material disposed between the plurality of active conductive material structures and second metal material of the N second wiring structures;
wherein the barrier material is selected from a group consisting of: titanium containing material, titanium nitride, titanium tungsten, titanium, tantalum, tantalum nitride, and tungsten nitride; and
wherein the second metal material is selected from a group consisting of: copper and aluminum.

* * * * *